US006150067A

United States Patent [19]

Koike et al.

[11] Patent Number: 6,150,067

[45] Date of Patent: Nov. 21, 2000

[54] HEAT-SENSITIVE RECORDING MATERIAL

[75] Inventors: Kazuyuki Koike, Shizuoka-ken; Hidetoshi Kobayashi, Kanagawa; Yasuhiro Ogata, Shizuoka-ken, all of Japan

[73] Assignee: Fuji Photo Film Co., Ltd., Kanagawa, Japan

[21] Appl. No.: 09/283,978

[22] Filed: Apr. 1, 1999

[30] Foreign Application Priority Data

Apr. 2, 1998 [JP] Japan .................................. 10-090226

[51] Int. Cl.$^7$ ...................................................... G03F 7/021

[52] U.S. Cl. .......................... 430/159; 430/157; 430/158; 430/160

[58] Field of Search .................................... 430/157, 158, 430/159, 160, 177, 179

[56] References Cited

U.S. PATENT DOCUMENTS

| | | | |
|---|---|---|---|
| 3,769,018 | 10/1973 | Hectors | 430/160 |
| 4,416,967 | 11/1983 | Matsuda et al. | 430/159 |
| 4,471,043 | 9/1984 | Van De Vorle | 430/159 |
| 4,869,993 | 9/1989 | Farahat et al. | 430/143 |
| 5,089,371 | 2/1992 | Nakamura et al. | 430/160 |
| 5,286,704 | 2/1994 | Yoshikawa et al. | 503/226 |
| 5,478,689 | 12/1995 | Rimoto et al. | 430/138 |

*Primary Examiner*—John S. Chu
*Attorney, Agent, or Firm*—Sughrue, Mion, Zinn, Macpeak & Seas, PLLC

[57] ABSTRACT

Disclosed is a heat-sensitive recording material comprising a support comprised of a substrate and a thermoplastic resin layer formed thereon, and a heat-sensitive recording layer disposed on the support and containing a diazonium salt compound capable of being decomposed by ultraviolet light, wherein the thermoplastic resin layer is formed by melt extrusion and wherein the thermoplastic resin layer contains a fluorescent brightening agent and a white pigment. In the heat-sensitive recording material, the fluorescent brightening agent is preferably a compound represented by the following structural formula (I):

Structural Formula (I)

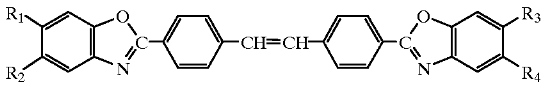

wherein $R_1$, $R_2$, $R_3$, and $R_4$ each represent a hydrogen atom, or a substituent group or a substituent atom.

10 Claims, No Drawings

HEAT-SENSITIVE RECORDING MATERIAL

BACKGROUND OF THE INVENTION

1. Field of the Invention

The present invention relates to a heat-sensitive recording material. More specifically, the present invention relates to a superior heat-sensitive recording material comprising a support, which is comprised of a substrate and a thermoplastic resin layer formed thereon, and a heat-sensitive recording layer disposed on the support, said heat-sensitive recording material being advantageous in that a fixing process is not inhibited at the time of image recording, the fixing time required is short, and the background region after the fixing process is white.

2. Description of the Related Art

When a heat-sensitive recording material containing a diazonium salt compound is used, the image recording process comprises heating the heat-sensitive recording material by a thermal head or the like, followed by a fixing process wherein the diazonium compound, which was not used for the image formation, is decomposed by irradiation with ultraviolet light. Since the background region after the fixing process is required to be as white as possible, a fluorescent brightening agent is added to the heat-sensitive recording layer. The use of the fluorescent brightening agent, however, presents a problem that the fluorescent brightening agent absorbs the ultraviolet light and inhibits the progress of the fixing process. Therefore the time required for the fixing process is prolonged speed up in the fixing process is impossible. A method has been proposed, wherein a fluorescent brightening agent, which is represented by UBITEX OB and has a bis(alkyl-substituted benzooxazolyl) thiophene-based structure, is added to a thermoplastic resin layer. However, this method is associated with the problem that a thermal treatment in an image recording process causes the bleeding out of the fluorescent brightening agent and therefore the whiteness of the background region is impaired.

SUMMARY OF THE INVENTION

The object of the present invention is to provide a superior heat-sensitive recording material advantageous in that fixing time is short because the progress of fixing process in image recording is not inhibited; and in that the background region after fixing process is white and image quality is excellent because no fluorescent brightening agent bleeds out from the thermoplastic resin layer.

The object can be achieved by the present invention described below.

<1> A heat-sensitive recording material comprising a support, which is comprised of a substrate and a thermoplastic resin layer formed thereon, and a heat-sensitive recording layer which is disposed on the support and contains a diazonium salt compound capable of being decomposed by ultraviolet light, wherein the thermoplastic resin layer is formed by melt extrusion and wherein the thermoplastic resin layer contains a fluorescent brightening agent and a white pigment.

<2> A heat-sensitive recording material according to <1>, wherein the fluorescent brightening agent is a compound represented by the following structural formula (I):

Structural Formula (I)

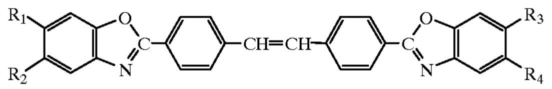

wherein $R_1$, $R_2$, $R_3$, and $R_4$ each represent a hydrogen atom, or a substituent group or a substituent atom.

<3> A heat-sensitive recording material according to <1> or <2>, wherein the content of the fluorescent brightening agent in the thermoplastic resin layer is in the range of from 0.02 to 0.10% by weight based on the thermoplastic resin.

<4> A heat-sensitive recording material according to any one of <1> to <3>, wherein the thermoplastic resin is a polyolefin resin.

<5> A heat-sensitive recording material according to any one of <1> to <4>, wherein the white pigment is titanium oxide.

<6> A heat-sensitive recording material according to any one of <1> to <5>, wherein the ultraviolet light has a wavelength in the range of from 300 to 400 nm.

According to the heat-sensitive recording material of the present invention, since the fluorescent brightening agent which absorbs ultraviolet light is contained in the melt-extruded thermoplastic resin layer, ultraviolet light is efficiently used for the decomposition of the diazonium salt compound in the heat-sensitive recording layer. Accordingly, the progress of the fixing process is not inhibited by the fluorescent brightening agent and the time required for the fixing is shortened. In addition, if the fluorescent brightening agent represented by the structural formula is used, the amount of bleeding-out of the fluorescent brightening agent is reduced.

DESCRIPTION OF THE PREFERRED EMBODIMENTS

The details of the present invention will be described hereinafter.

The heat-sensitive recording material of the present invention comprises a support and a heat-sensitive recording layer disposed thereon. In addition to the heat-sensitive recording layer, other layers, if necessary, may be disposed on the support.

[Support]

In the present invention, a thermoplastic resin layer is formed by melt extrusion either on both sides or one side (at least on the side where the heat-sensitive recording layer is formed) of a substrate. Examples of the support include (1) a support produced by melt-extruding a thermoplastic resin on a substrate; (2) a support produced by laminating an appropriate known plastic film to a substrate and then melt-extruding a thermoplastic resin on the plastic film; and (3) a support produced by extruding a thermoplastic resin on a substrate and then laminating an appropriate known plastic film to the thermoplastic resin.

(Substrate)

An example of the substrate is a base paper composed of commonly employed materials. The main component of the paper is a natural pulp made from either a needle-leaf tree or a broad-leaf tree material. If necessary, the pulp is admixed with a filler such as clay, talc, titanium oxide, calcium carbonate, and particles of a urea resin; a sizing agent such as rosin, an alkylketene dimer, a higher fatty acid, an epoxidized fatty acid amide, a paraffin wax, and an alkenyl succinate; a strengthening agent such as a polyacrylamide, starch, and a polyamidepolyamine/epichlorohydrin adduct; or a fixing agent such as aluminum sulfate, and a cationic polymer. In addition, a softener such as an epoxidized fatty acid amide and a surfactant may be added to the pulp. Alternatively, a synthetic pulp may be used in place of the natural pulp, or a mixture comprising a natural pulp and a synthetic pulp of a desired proportion may be used.

Although the type and thickness of the substrate are not particularly limited, it is preferable if the basis weight is between 40 to 200 $g/m^2$. It is also preferable if the surface of the substrate is heat-treated under pressure by a calender, a soft calender or a super calender to provide a smooth and flat surface, because it is vital that the material has an extremely flat surface.

It is preferable that both sides of the substrate are coated with a surface sizing agent. The surface sizing agent may be an aqueous solution of polyvinyl alcohol and/or a modified product thereof. Other components may be added to the sizing agent. Examples of these other components are a polymeric compound such as starch, CMC, HEC, sodium alginate, and gelatin; a metal salt such as calcium chloride, sodium chloride and sodium sulfate; a hygroscopic substance such as glycerin and polyethylene glycol; a coloring or brightening agent such as a dye and a fluorescent brightening agent; and a pH controlling agent such as sodium hydroxide, ammonia water, hydrochloric acid, sulfuric acid and sodium carbonate.

Further, a softener such as an epoxidized fatty acid amide and a surfactant maybe added to the sizing agent. If necessary, the sizing agent may further contain a pigment. A size press, a sizing tub, or a gate roll coater is used to add and coat the above components to the substrate.

Prior to melt-extruding a resin layer on the substrate, the substrate is preferably pre-treated in order to strengthen the adhesion between the substrate and the thermoplastic resin layer.

Examples of the pre-treatment include an acid-etching treatment by use of a sulfuric acid/chromic acid mixture, a flame treatment by means of a gas flame, a UV irradiation, a corona discharge, a glow discharge, application of an anchor coating such as alkyl titanate. The pre-treatment may be appropriately selected from these pre-treatments. Because of the simplicity of the treatment, a corona discharge treatment is preferable. In the case of the corona discharge treatment, it is preferable that the contact angle with water does not exceed 70°.

Examples of known anchor coating agents usable herein include organo-titanium compounds, isocyanates (urethanes), polyethylene imines, and polybutadienes. More specifically, examples of the organo-titanium compounds include an alkyl titanate such as tetraisopropyl titanate, tetrabutyl titanate, and tetrastearyl titanate; a titanium acylate such as butoxytitanium stearate; and a titanium chelate such as titanium acetylacetonate. Examples of the isocyanates (urethanes) include toluene diisocyanate (TDI), diphenylmethane diisocyante (MDI), hexamethylene diisocyanate (HMDI), xylylene diisocyanate (XDI) and isophorone diisocyante (IPDI).

(Thermoplastic Resin Layer)

The thermoplastic resin layer comprises a thermoplastic resin, a fluorescent brightening agent and a white pigment, as well as optionally other components, if necessary.

Thermoplastic Resin

Although the thermoplastic resins for use in the present invention are not particularly limited, a preferred example of the thermoplastic resin is an olefinic resin. Preferable are a homopolymer of an $^{\alpha}$-olefin such as polyethylene or polypropylene, a mixture of these polymers, or an ethylene/vinyl alcohol random copolymer.

In the case where polyethylene is used, for example, LDPE(low-density polyethylene), HDPE(high-density polyethylene), and L-LDPE(linear low-density polyethylene) can be used singly or plurally.

In the case of polyethylene, the melt flow rate before use thereof is preferably in the range of from 1.2 to 12 g/10 minutes in accordance with the method described in JIS 7201 (condition 4 of Table 1).

Fluorescent Brightening Agent

The fluorescent brightening agent can be classified according to the basic chemical structure which emits fluorescent light.

Specifically, examples of the fluorescent brightening agents are diaminostylbene-based, imidazole-based, thiazole-based, oxazole-based, triazole-based, oxadiazole-based, thiadiazole-based, coumarin-based, naphthalimide-based, pyrazoline-based, pyrene-based, imidazolone-based, benzidine-based, diaminocarbazole-based, oxacyanine-based, methine-based, pyridine-based, anthrapyridazine-based, distyryl-based, carbostrylyl-based compounds, and the like.

Preferred examples of the fluorescent brightening agent may include, but are not limited to, imidazole-based compounds, thiazole-based compounds, oxazole-based compounds represented by the formulas 1-(1) to 1-(22), triazole-based compounds represented by the formulas 2-(1) to 2-(2), coumarin-based compounds represented by the formulas 3-(1) to 3-(8), phthalimide-based compounds represented by the formulas 4-(1) to 4-(3), and pyrazoline-based compounds represented by the formula 5-(1), and others (compounds represented by the formulas 6-(1) to 6-(7)).

1-(1)

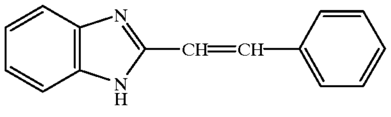

1-(2)

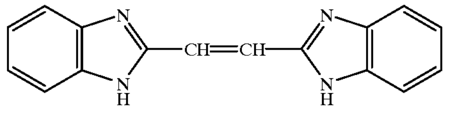

1-(3)

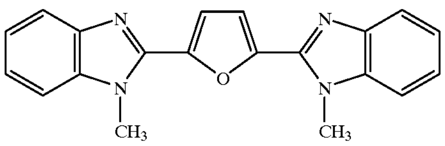

1-(4)

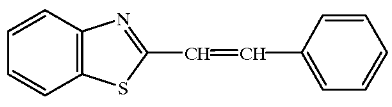

-continued
1-(5)
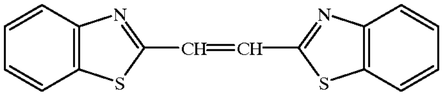
1-(6)
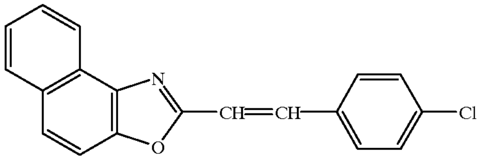
1-(7)
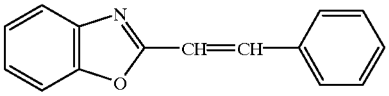
1-(8)
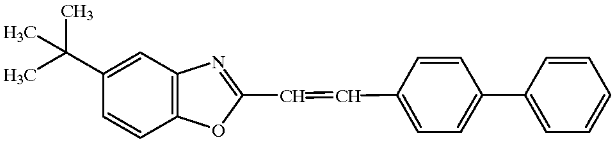
1-(9)
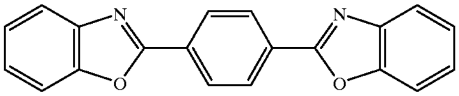
1-(10)
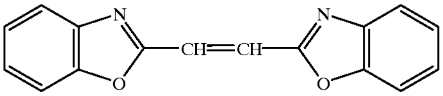
1-(11)
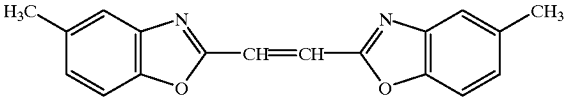
1-(12)
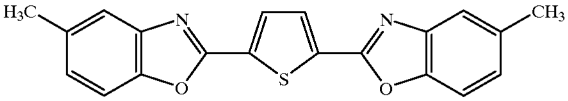
1-(13)
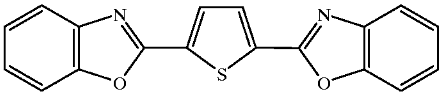
1-(14)
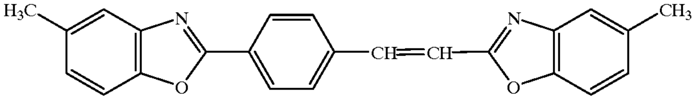
1-(15)
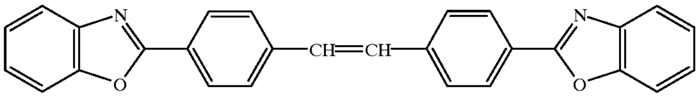
1-(16)
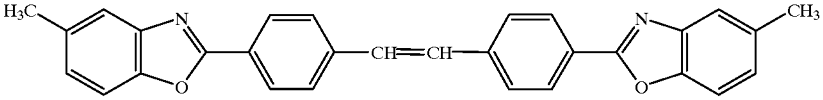
1-(17)
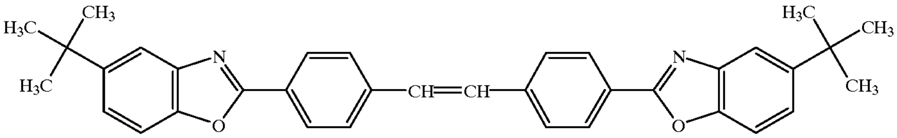

-continued
1-(18)
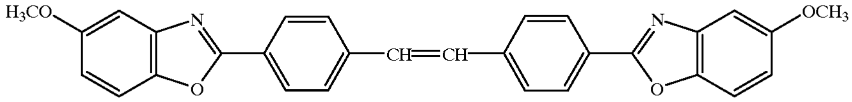
1-(19)
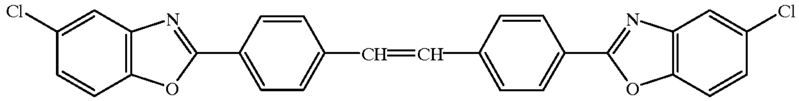
Mixture of
1-(20)
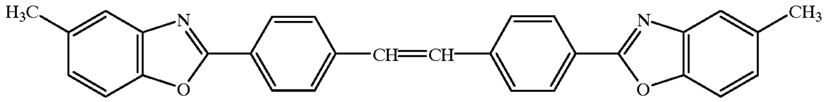
and
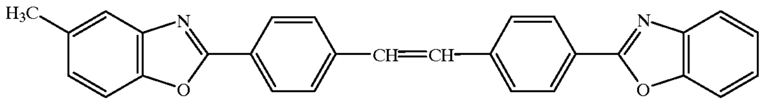
and
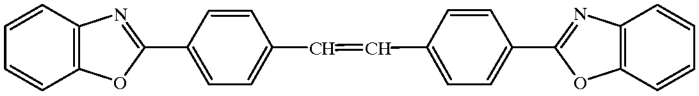
1-(21)
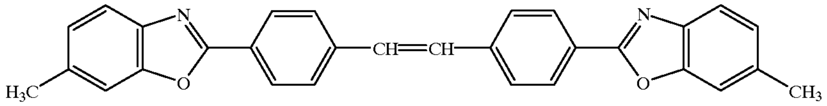
1-(22)
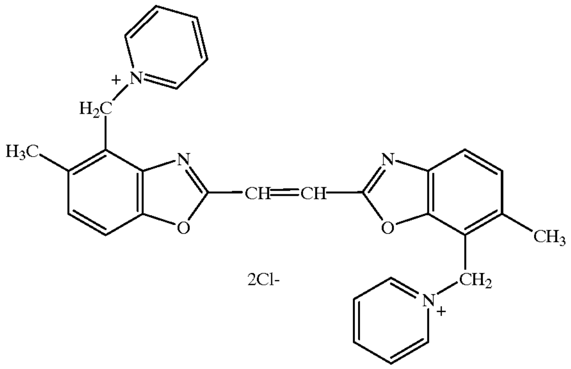
2-(1)
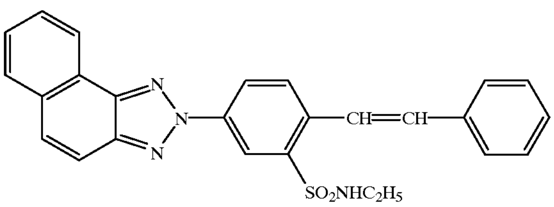
2-(2)
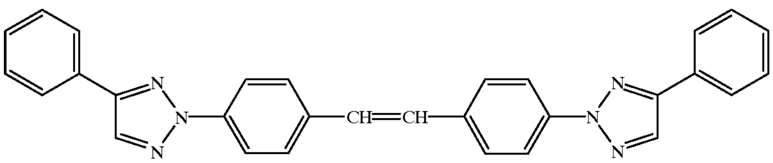

-continued
3-(1)
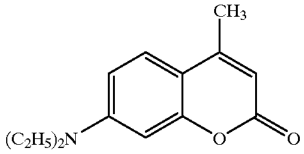
3-(2)
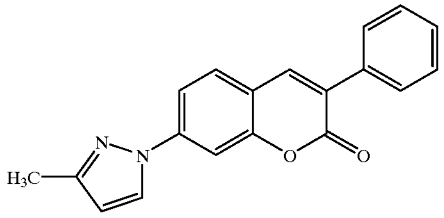
3-(3)
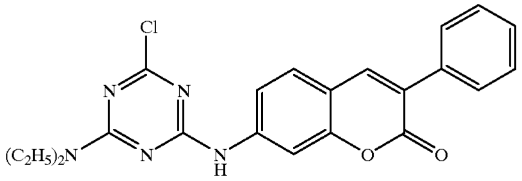
3-(4)
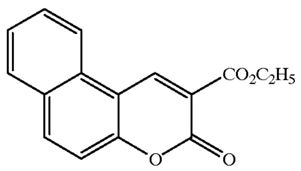
3-(5)
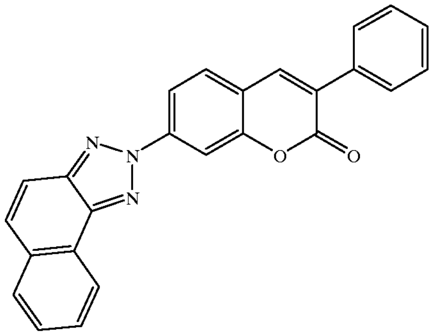
3-(6)
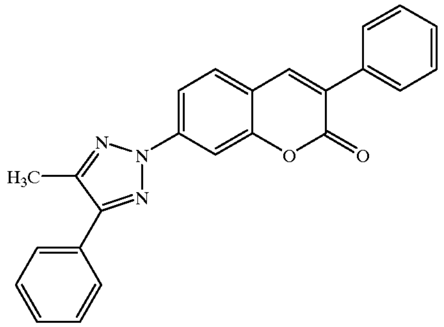
3-(7)
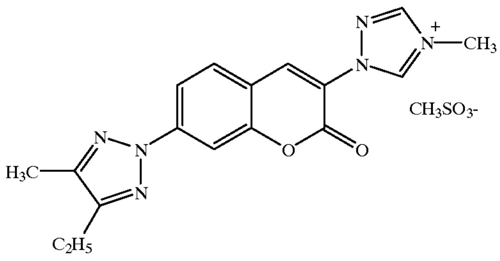
3-(8)
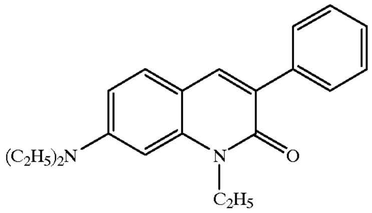
4-(1)
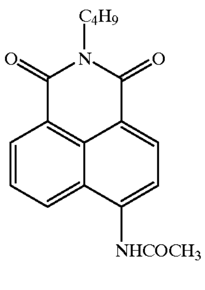
4-(2)
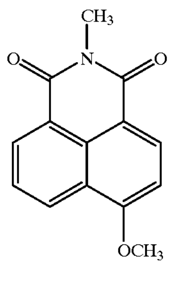

-continued
4-(3)
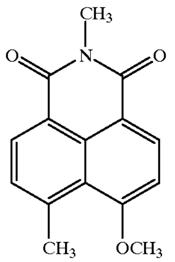
5-(1)
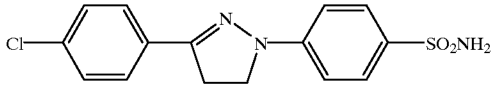
6-(1)
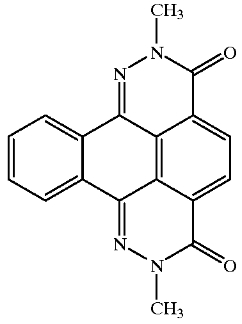
6-(2)
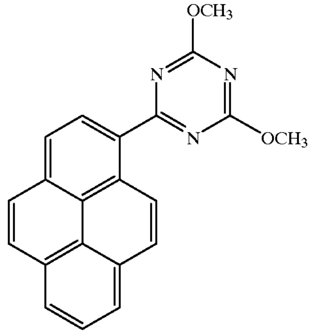
6-(3)
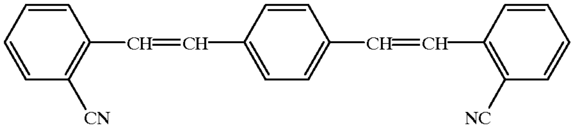
6-(4)
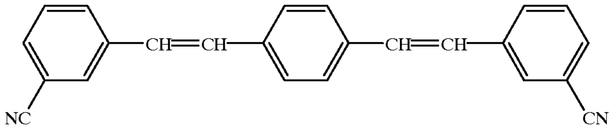
6-(5)
6-(6)
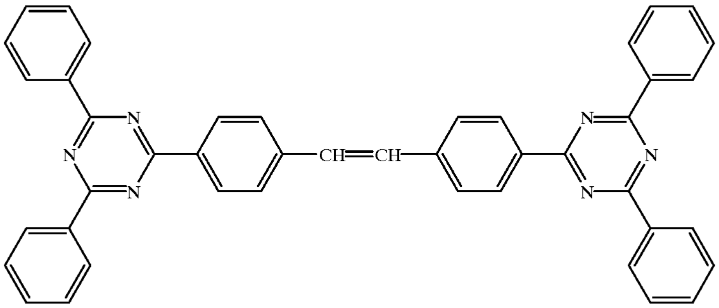
6-(7)
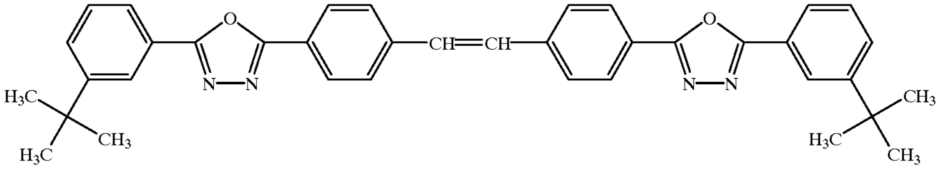

Among the fluorescent brightening agents listed, the compound represented by the following structural formula (I) is particularly preferred from the standpoint of prevention of bleeding-out of the fluorescent brightening agent from the thermoplastic resin layer.

Structural Formula (I)

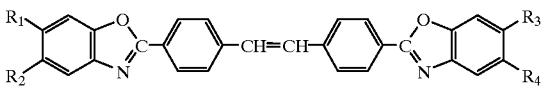

wherein $R_1$, $R_2$, $R_3$, and $R_4$ each independently represent a hydrogen atom, or a substituent group or a substituent atom.

Some examples of the substituent group include an alkyl group having 1 to 12 carbon atoms (e.g., methyl, ethyl, propyl, butyl, octyl and the like), alkoxy groups having 1 to 12 carbon atoms (e.g., methoxy, ethoxy, propoxy, butoxy, octyloxy and the like), alkoxycarbonyl groups having 2 to 12 carbon atoms (e.g., methoxycarbonyl and the like), acyloxy groups having 2 to 12 carbon atoms (e.g., acetyloxy and the like), aryl groups having 6 to 12 carbon atoms (e.g., phenyl, tolyl and the like), aryloxy groups having 6 to 12 carbon atoms (e.g., phenoxy, phenoxyethoxy and the like), aryloxycarbonyl groups having 7 to 12 carbon atoms, a hydroxy group, a nitro group, a cyano group, an amino group, mono- or di-alkylamino groups having 1 to 12 carbon atoms (e.g., dimethylamino, diethylamino and the like), mono- or di-arylamino groups having 6 to 12 carbon atoms, and acylamino groups having 1 to 12 carbon atoms (e.g., acetylamino, and the like).

These groups may have additional substituent groups, which maybe the above-mentioned substituent groups. Examples of the group having an additional substituent group include an aryl-substituted alkyl group such as benzyl, phenethyl and the like; and an aryl-substituted alkoxy group such as benzyloxy and the like.

Some examples of the substituent atom include halogen atoms (e.g., a fluorine atom, a chlorine atom, a bromine atom, and the like).

Specific examples of the fluorescent brightening agents represented by the structural formula (I) are given below. These fluorescent brightening agents may be used in a combination of two or more. The fluorescent brightening agents represented by the following structural formula (IV) or (V) are preferable from the standpoint of reduced bleeding-out and shorter fixing time of diazonium salt compounds.

Structural Formula (II)

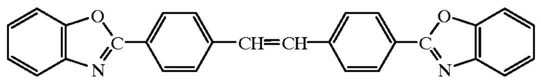

Structural Formula (III)

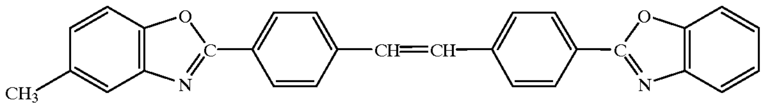

Structural Formula (IV)

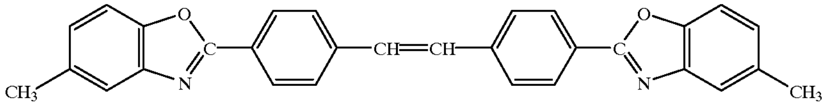

Structural Formula (V)

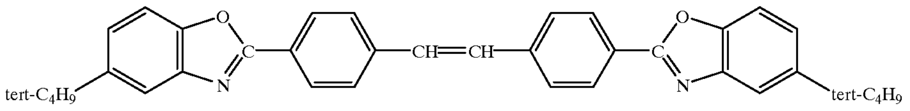

Structural Formula (VI)

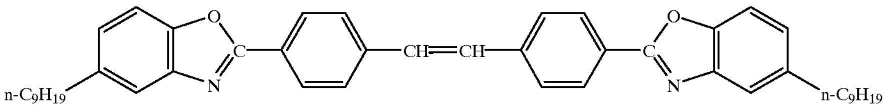

If the content of the fluorescent brightening agent in the thermoplastic resin layer falls within the range, the excellent whiteness of the background region is provided without bleeding-out of the fluorescent brightening agent.

The method for producing the fluorescent brightening agent for use in the present invention is not particularly limited, and a conventionally known method can be employed. A commercially available fluorescent brightening agent can also be used in the present invention.

White Pigment

Examples of the white pigment include titanium oxide, bariumsulfate, bariumcarbonate, calciumcarbonate, lithopone, alumina, zinc oxide, silica, antimony trioxide, and titanium phosphate. These pigments may be used singly or in a combination of two or more. Among these pigments, titanium oxide is preferred from the viewpoint of whiteness, dispersibility and stability.

The amount of the white pigment added to the thermoplastic resin layer varies depending on such factors as the type of white pigment used, the type of thermoplastic resin used, the thickness of the thermoplastic resin layer, and the like. However, the amount is usually in the range of from 5 to 20% by weight of the thermoplastic resin.

The titanium oxide may be of a rutile type or of an anatase type. These types may be used singly or in a combination. The titanium oxide may be produced by a sulfuric acid process or by a hydrochloric acid process. The titanium oxide may be surface-treated. For example, the titanium oxide may be surface-treated with an inorganic substance such as hydrated alumina, hydrated silicon dioxide, or zinc oxide; surface-treated with an organic substance such as trimethylolmethane, trimethylolethane, trimethylolpropane or 2,4-dihydroxy-2-methylpentane; or surface-treated with a siloxane such as a polydimethylsiloxane. A known additive such as an antioxidant may also be added to the thermoplastic resin layer.

Preparation of a Thermoplastic Resin Layer

Usually, a so-called compound, which comprises a polyolefinic resin as the thermoplastic resin and prescribed proportions of the fluorescent brightening agent and the white pigment blended in the polyolefinic resin, is first prepared. In the preparation of the compound, a conventionally known blending machine is used for blending the components. Examples of the blending machine include a Banbury mixer, a kneader, a blending extruder, a two-roll mill, and a three-roll mill. Among these machines, a Banbury mixer and a blending extruder are preferable. A combination of two or more of these blending machines may also be employed. The compound thus prepared is melt-extruded on the substrate by use of a conventionally known melt extruder.

Although the thickness of the thermoplastic resin layer melt-extruded on the substrate is not particularly limited, a thickness in the range of from 10 to 601 $\mu$m is usually preferred.

[Heat-Sensitive Recording Layer]

The heat-sensitive recording layer comprises a diazonium salt compound and, if necessary, other components.

(Diazonium Salt Compound)

The diazonium salt compound is a color forming component for use in the heat-sensitive recording layer.

The diazonium salt compound is one expressed by the following compound. This is a compound whose maximum absorption wavelength can be controlled by the type and position of the substituent in the Ar portion.

$$Ar—N_2^+X^-$$

where Ar represents an aryl group, and X represents an acid anion.

Specific examples of the diazonium salt compound in the present invention include acid-anion salts such as 4-(N-(2-(2,4-di-tert-mylphenoxy)butyryl)piperazino)benzene diazonium, 4-dioctylaminobenzene diazonium,
4-(N-(2-ethylhexanoyl)piperazino)benzene diazonium,
4-dihexylamino-2-hexyloxybenzene diazonium,
4-N-ethyl-N-hexadecylamino-2-ethoxybenzodiazonium,
3-chloro-4-dioctylamino-2-octyloxybenzene diazonium,
2,5-dibutoxy-4-morpholinobenzene diazonium,
2,5-octoxy-4-morpholinobenzene diazonium,
2,5-dibutoxy-4-(N-(2-ethylhexanoyl)piperazino)benzene diazonium, 2,5-diethoxy-4-(N-(2-(2,4-di-tert-amylphenoxy)butyryl)piperazino)benzene diazonium,
2,5-dibutoxy-4-tolylthiobenzene diazonium,
3-(2-octyloxyethoxy)-4-morpholinobenzene diazonium, and the like, and the following diazonium salt compounds D-1 to 5.

Among these compounds, a hexafluorophosphate salt, tetrafluoroborate salt and 1,5-naphthalene sulfonate salt are particularly preferred.

D-1

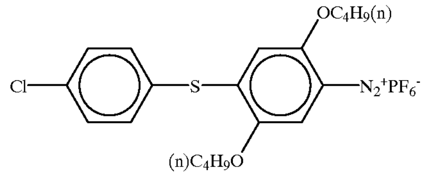

D-2

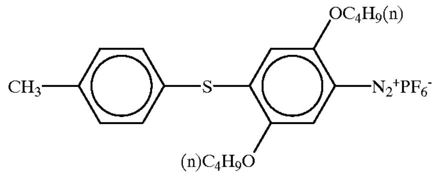

D-3

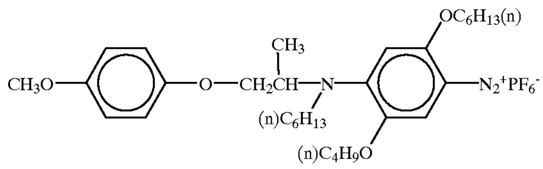

D-4

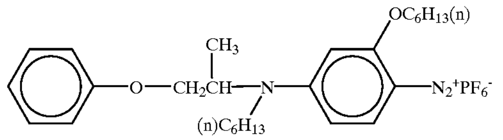

D-5

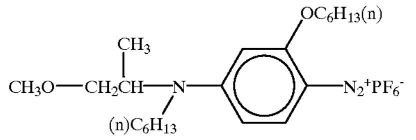

In the present invention, particularly preferred diazonium salt compounds are those which are decomposed by ultraviolet light having wavelength in the range of from 300 to 400 nm.

Among these diazonium salt compounds, examples of particularly preferable compounds in the present invention include 4-(N-(2-(2,4-di-tert-mylphenoxy)butyryl)piperazino) benzene diazonium, 4-dioctylaminobenzene diazonium, 4-(N-(2-ethylhexanoyl)piperazino)benzene diazonium, 4-dihexylamino-2-hexyloxybenzene diazonium, 4-N-ethyl-N-hexadecylamino-2-ethoxybenzodiazonium, 2,5-dibutoxy-4-(N-(2-ethylhexanoyl)piperazino)benzene diazonium, 2,5-diethoxy-4-(N-(2-(2,4-di-tert-amylphenoxy)butyryl)piperazino)benzene diazonium, and the compounds listed as specific examples in D-3 to 5.

The maximum absorption wavelength of the diazonium salt compounds herein referred to is a value obtained by measuring the absorbance of a coated layer of each compound in an amount of 0.1 g/$m^2$ to 1.0 g/$m^2$ using a spectrophotometer (Shimazu MPS-2000 manufactured by Shimazu Corporation).

(Other components)

Coupler

In the present invention, a coupler capable of forming a dye by reacting under heat with a diazonium salt compound is preferably used as a color forming component for use in the heat-sensitive recording layer.

Specific examples of the coupler include resorcin, phloroglucin, sodium 2,3-dihydroxynaphthalene-6-sulfonate, 1-hydroxy-2-naphthoic acid morpholinopropylamide, 1,5-dihydroxynaphthalene, 2,3-dihydroxynaphthalene, 2,3-dihydroxy-6-sulfanylnaphthalene, 2-hydroxy-3-naphthoic acid anilide, 2-hydroxy-3-naphthoic acid ethanolamide, 2-hydroxy-3-naphthoic acid octylamide, 2-hydroxy-3-naphthoic acid-N-dodecyloxypropylamide, 2-hydroxy-3-naphthoic acid tetradecylamide, acetanilide, acetoacetanilide, benzoylacetanilide, 2-chloro-5-octylacetoacetanilide, 1-phenyl-3-methyl-5-pyrazolone, 1-(2'-octylphenyl)-3-methyl-5-pyrazolone, 1-(2',4',6'-trichlorophenyl)-3-benzamido-5-pyrazolone, 1-(2',4',6'-trichlorophenyl)-3-anilino-5-pyrazolone, 1-phenyl-3-phenylacetamide-5-pyrazolone, and further, the following C-1 to C-6 compounds, and the like.

These couplers can also be used in combinations of two or more for the formation of a desired hue.

C-1

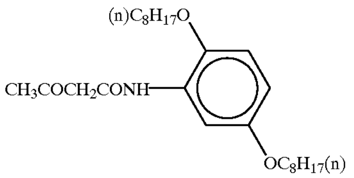

C-2

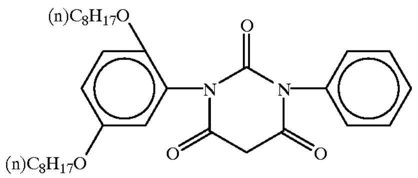

-continued

C-3

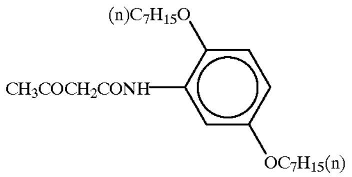

C-4

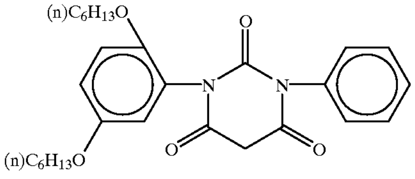

C-5

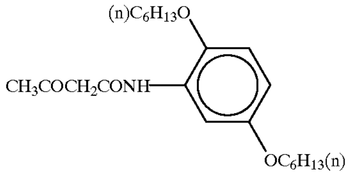

C-6

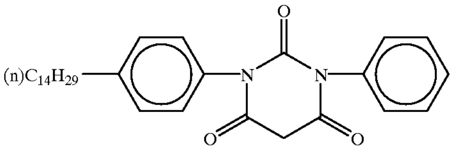

Basic Substance

In addition, it is preferable to use a basic substance which accelerates the reaction between a diazonium salt and a coupler in the present invention.

The basic substance in the heat-sensitive recording layer includes compounds which cause decomposition and the like when heated to release an alkaline substance, in addition to inorganic or organic basic compounds.

Representative examples thereof include nitrogen-containing compounds such as organic ammonium salts, organic amines, amides, urea and thiourea and derivatives thereof, thiazoles, pyrroles, pyrimidines, piperazines, guanidines, indoles, imidazoles, imidazolines, triazoles, morpholines, piperidines, amidines, formazines, pyridines, and the like.

Specific examples thereof include tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-dicyclohexylguanidine, 1,2,3-tricyclohexylguanidine, guanidine trichloroacetate salt, N,N'-dibenzylpiperazine, 4,4'-dithiomorpholine, morpholinium trichloroacetate, 2-aminobenzothiazole, 2-benzoylhydrazinobenzothiazole, and the like. These can be used in combinations of two or more.

Electron-donative Colorless Dye

Also suited for use as color forming components in the heat-sensitive recording material are those utilizing a reaction between an electron-donative colorless dye and an electron-acceptive compound.

An electron-donative dye precursor can be used as the electron-donative colorless dye. Examples of the precursor include a triarylmethane-based compound, a diphenylmethane-based compound, a thiazine-based compound, a xanthene-based compound, a spiropyran-based compound, and the like. Among these compounds, a triarylmethane-based compound and a xanthene-based compound are especially useful due to their high color developing density.

Specific examples thereof include 3,3-bis(p-dimethylaminophenyl)-6-dimethylaminophthalide (namely, crystal violet lactone),
3,3-bis(p-dimethylamino)phthalide,
3-(p-dimethylaminophenyl)-3-(1,3-dimethylindole-3-yl)phthalide, 3-(p-dimethylaminophenyl)-3-(2-methylindole-3-yl)phthalide, 3-(o-methyl-p-diethylaminophenyl)-3-(2-methylindole-3-yl)phthalide,
4,4'-bis(dimethylamino)benzhydrinbenzyl ether,
N-halophenylleucoauramine,
N-2,4,5-trichlorophenylleucoauramine,
rhodamine-B-anilinolactam, rhodamine(p-nitroanilino)lactam,
rhodamine-B-(p-chloroanilino)lactam,
2-benzylamino-6-diethylaminofluoran,
2-anilino-6-diethylaminofluoran,
2-anilino-3-methyl-6-diethylaminofluoran,
2-anilino-3-methyl-6-cyclohexylmethylaminofluoran,
2-anilino-3-methyl-6-isoamylethylaminofluoran,
2-(o-chloroanilino)-6-diethylaminofluoran, 2-octylamino-6-diethylaminofluoran, 2-ethoxyethylamino-3-chloro-2-diethylaminofluoran,
2-anilino-3-chloro-6-diethylaminofluoran,
benzoylleucomethylene blue, p-nitrobenzylleucomethylene blue,
3-methyl-spiro-dinaphthopyran, 3-ethyl-spiro-dinaphthopyran,
3,3'-dichloro-spiro-dinaphthopyran,
3-benzylspirodinaphthopyran, 3-propyl-spiro-dibenzopyran, and the like.

Electron-acceptive Compound

As the electron-acceptive compound, a phenol derivative, salicylic acid derivative, hydroxybenzoate, and the like are listed. Particularly, bisphenols and hydroxybenzoates are preferred.

Specific examples thereof include 2,2-bis(p-hydroxyphenyl)propane (namely, bisphenol A),
4,4'-(p-phenylenediisopropylidene)diphenol (namely, bisphenol P), 2,2-bis(p-hydroxyphenyl)pentane,
2,2-bis(p-hydroxyphenyl)ethane,
2,2-bis(p-hydroxyphenyl)butane,
2,2-bis(4'-hydroxy-3',5'-dichlorophenyl)propane, 1,1-(p-hydroxyphenyl)cyclohexane, 1,1-(p-hydroxyphenyl)propane,
1,1-(p-hydroxyphenyl)pentane, 1,1-(p-hydroxyphenyl)-2-ethylhexane, 3,5-di($^{\alpha}$-methylbenzyl)salicylic acid and polyvalent metal salts thereof, 3,5-di(tert-butyl)salicylic acid and polyvalent metal salts thereof, 3-$^{\alpha}$, $^{\alpha}$-dimethylbenzylsalicylic acid and polyvalent metal salts thereof, butyl p-hydroxybenzoate, benzyl p-hydroxybenzoate, 2-ethylhexyl p-hydroxybenzoate, p-phenylphenol, p-cumylphenol, and the like.

Sensitizer

One of the other components is preferably a sensitizer.

As the sensitizer, an organic compound having a low melting point suitably comprising an aromatic group and a polar group in the molecule in desired amounts is preferred. Examples thereof include benzyl p-benzyloxybenzoate, $^{\alpha}$-naphthyl benzyl ether, $^{\beta}$-naphthyl benzyl ether, phenyl $^{\beta}$-naphtoate, phenyl $^{\alpha}$-hydroxy-$^{\beta}$-naphtoate, $^{\beta}$-naphthol-(p-chlorobenzyl) ether, 1,4-butane diol-phenyl ether, 1,4-butane diol-p-methylphenyl ether, 1,4-butane diol-p-ethylphenyl ether, 1,4-butane diol-m-methylphenyl ether, 1-phenoxy-2-(p-tolyloxy)ethane, 1-phenoxy-2-(p-ethylphenoxy)ethane, 1-phenoxy-2-(p-chlorophenoxy)ethane, p-benzylbiphenyl, and the like.

(Dispersing the Components, and Others)

In the present invention, modes for using the diazonium salt compound, the coupler which develops color by reacting under heat with the diazonium salt compound, the basic substance, the electron-donative colorless dye, the electron-acceptive compound, and the sensitizer are not particularly restricted.

Examples of the modes include (1) a method in which the material is solid-dispersed for use, (2) a method in which the material is emulsion-dispersed for use, (3) a method in which the material is polymer-dispersed for use, (4) a method in which the material is latex-dispersed for use, (5) a method in which the material is micro-encapsulated for use, and the like. Among these, the micro-encapsulation method is preferred because of better storage stability. Particularly, in the color developing system utilizing a reaction of the diazonium salt compound with the coupler, micro-encapsulation of the diazonium salt compound is preferable, while in the color developing system utilizing a reaction of the electron-donative colorless dye with the electron-acceptive compound, micro-encapsulation of the electron-donative colorless dye is preferable.

In the emulsion-dispersion method, the compound such as a diazonium salt compound is first dissolved in an oil. This oil may be solid or liquid at ordinary temperature, and may be a polymer.

Examples the oil include auxiliary solvents having a low boiling point such as acetate ester, methylene chloride, cyclohexanone, and the like and/or phosphate esters, phthalate esters, acrylate esters, methacrylate esters, other carboxylate esters, fatty acid amides, alkylated biphenyls, alkylated terphenyls, alkylated naphthalenes, diarylethanes, chlorinated paraffins, alcohols, phenols, ethers, monoolefins, epoxy compounds, and the like.

Specific examples thereof include oils having a high boiling point such as tricresyl phosphate, trioctyl phosphate, octyldiphenyl phosphate, tricyclohexyl phosphate, dibutyl phthalate, dioctyl phthalate, dilauryl phthalate, dicyclohexyl phthalate, butyl oleate, diethylene glycol benzoate, dioctyl sebacate, dibutyl sebacate, dioctyl adipate, trioctyl trimellitate, acetyltriethyl citrate, octyl maleate, dibutyl maleate, isoamylbiphenyl, chlorinated paraffin, diisopropylnaphthalene, 1,1'-ditolylethane, 2,4-di-tert-aryamylphenol, N,N-dibutyl-2-butoxy-5-tert-octylaniline, 2-ethylhexyl hydroxybenzoate, polyethylene glycol, and the like. Among these, alcohols, phosphate esters, carboxylate esters, alkylatedbiphenyls, alkylated terphenyls, alkylated naphthalenes, and diarylethanes are particularly preferred.

Further, a carbonization preventing agent such as a hindered phenol, a hindered amine and the like may be added to the above-described high boiling point oils. As the oil for use with the aforementioned compound such as a diazonium salt compound, one comprising an unsaturated fatty acid is particularly desirable, and $^{\alpha}$-methylstyrene dimer and the like can be listed as examples. As the $^{\alpha}$-methylstyrene dimer, for example, MSD 100 (trade name of Mitsui Toatsu Chemicals, Inc.) and the like are listed.

An oil solution containing the compound such as the diazonium salt compound is added into an aqueous solution of a water-soluble polymer, and the mixture is emulsified by a colloid mill, homogenizer, or ultrasonic wave. As the water-soluble polymer used therein, a water-soluble polymer such as polyvinyl alcohol and the like is used. If necessary, a hydrophobic polymer emulsion or latex can also be used.

Examples of the water-soluble polymer include polyvinyl alcohol, silanol-modified polyvinyl alcohol, carboxy-modified polyvinyl alcohol, amino-modified polyvinyl alcohol, itaconic acid-modified polyvinyl alcohol, a styrene-maleic anhydride copolymer, a butadiene-maleic anhydride copolymer, an ethylene-maleic anhydride copolymer, an isobutylene-maleic anhydride copolymer, a polyacrylamide, a polystyrenesulfonic acid, a polyvinylpyrrolidone, an ethylene-acrylic acid copolymer, gelatin, and the like. At this time, a conventionally known surfactant and the like may be added, if necessary.

As for the micro-encapsulation of the compound such as the diazonium salt compound, a conventionally known method for micro-encapsulation can be used. Namely, microcapsules can be prepared by a process comprising the steps of dissolving the diazonium salt compound and a microcapsule wall precursor in an organic solvent which is poorly soluble or insoluble in water, adding the resulting solution into an aqueous solution of a water-soluble polymer, emulsifying the mixture using a homogenizer and the like, and raising the temperature so that a polymeric material which functions as a microcapsule wall is formed at the oil/water interface.

Specific examples of the polymer material used for the wall layer of a microcapsule include a polyurethane resin, a polyurea resin, a polyamide resin, a polyester resin, a polycarbonate resin, an aminoaldehyde resin, a melamine resin, a polystyrene resin, a styrene-acrylate copolymer resin, a styrene-methacrylate copolymer resin, gelatin, polyvinyl alcohol, and the like.

Among these, a particularly preferable microcapsule is a microcapsule having a wall layer comprised of a polyurethane and/or polyurea resin. The microcapsule having a wall layer comprised of a polyurethane and/or polyurea resin is produced by a process comprising the steps of blending a microcapsule wall precursor such as polyvalent isocyanate or the like into a core material to be encapsulated, emulsifying the resulting mixture in an aqueous solution of a water-soluble polymer such as polyvinyl alcohol or the like, and raising the temperature of the liquid to cause a polymer forming reaction at the interface of an oil droplet and water.

A portion of the specific examples of the polyvalent isocyanate compound is shown below. Examples thereof include diisocyanates such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-diphenylmethane-4,4'-diisocyanate, xylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate and the like; triisocyanates such as 4,4',4"-triphenylmethane triisocyanate, toluene-2,4,6-triisocyanate and the like; tetraisocyanates such as 4,4'-dimethyldiphenylmethane-2,2',5,5'-tetraisocyanate and the like; isocyanate prepolymers such as an adduct of hexamethylene diisocyanate with trimethylolpropane, an adduct of 2,4-tolylene diisocyanate with trimethylolpropane, an adduct of xylylene diisocyanate with trimethylolpropane, an adduct of tolylene diisocyanate with hexane triol and the like.

Further, they can be used in combinations of two or more, if necessary. Among these, a compound containing three or more isocyanate groups in the molecule is particularly preferred.

As the organic solvent for dissolving the compound such as the diazonium salt compound in the micro-encapsulation process, the oils listed for the emulsification can be used, and the same applies to the water-soluble polymer.

The particle size of the microcapsule is preferably in the range of from 0.1 to 1.0 μm, and more preferably in the range of from 0.2 to 0.7 μm.

In the present invention, the above-described heat-sensitive recording layers may be laminated, and a multicolor heat-sensitive recording material can be obtained by changing the hue of each heat sensitive-recording layer. The constitution of the layers is not particularly restricted, and a preferred multicolor heat-sensitive recording material comprises a stack of layers including two heat-sensitive recording layers containing two diazonium salt compounds sensitive to different wavelengths and couplers which develop different hues by reacting under heat with the diazonium salt compounds in respective combinations, and a heat sensitive-recording layer containing an electron-donative colorless dye and an electron-acceptive compound in combination.

Namely, preferred is a multicolor heat-sensitive recording material comprising a support having thereon a heat-sensitive recording layer (A) containing an electron-donative colorless dye and an electron-acceptive compound, a heat-sensitive recording layer (B-1) containing a diazonium compound having a maximum absorption wavelength of 360±20 nm and a coupler which develops color by reacting under heat with the diazonium salt compound, and a heat-sensitive recording layer (B-2) containing a diazonium compound having a maximum absorption wavelength of 400±20 nm and a coupler which develops color by reacting under heat with the diazonium salt compound.

[Other Layers]

(Primer Layer)

In the heat-sensitive recording material of the present invention, it is preferable to interpose a primer layer between the thermoplastic resin layer and the heat-sensitive recording layer.

Preferably, the primer layer comprises a binder as a main component and other additives such as a hardener and the like.

In the present invention, the primer layer comprises preferably a binder, a hardener and/or a tabular inorganic compound, and more preferably a binder, a hardener and a tabular inorganic compound.

Examples of the binder for use in the present invention include gelatin, casein, a phenolic resin, a urea resin, a melamine resin, and an epoxy resin. The binder is preferably casein or gelatin, and more preferably gelatin.

An example of the gelatin is a conventionally known gelatin (ordinary gelatin). The term "ordinary gelatin" as used herein means the gelatin produced by treating a material, such as ox bone, ox hide or pig hide, with a lime, an acid, or the like, as described in, for example, "Glue and gelatin" (edited by Y. Abiko, issued from Japan Association of Glue and Gelatin Industry, 1987). Also usable is the gelatin, which is described in Japanese Patent Application No. 9-196,196 and which has a low molecular weight and a low viscosity. This type of gelatin is preferably used for gravure coating and the like. The molecular weight of the casein is preferably in the range of from 80,000 to 300,000.

The hardener for use in the present invention may be a conventionally known one which is used for hardening a gelatin film. Examples of the hardener include vinylsulfonic acids, activated silver halides, isocyanates, and epoxides. Among these compounds, epoxides are particularly preferable.

The tabular inorganic compound used in the present invention is effective in rendering the primer layer oxygen-untransmissive and lightfast, and also in adjusting the elasticity of the primer layer.

The tabular inorganic compound is one which can be swollen with water. Examples of the compound include swellable clay minerals such as bentonite, hectorite, saponite, pyrargyrite, nontronite, stibensite, beidellite, montmorillonite and the like; swellable synthetic mica; swellable synthetic smectite and the like.

These water-swellable, tabular inorganic compounds have a laminate structure composed of unit crystal lattice layers each having a thickness of 10 to 15 angstroms wherein the amount of substitution of intra-lattice metal atoms is markedly larger than in other clay minerals. As a result, in order to compensate for the deficiency of positive charge in the lattice layer, cations such as $Na^+$, $Ca^{2+}$, and $Mg^{2+}$ are adsorbed between layers. These cations present between layers are called interchangeable cations, and they interchange with other cations. Particularly, if the interlayer cations are $Li^+$, $Na^+$, and the like, the ion radius is small and the bond between laminate crystal lattices is weak. Therefore, the compound is significantly swollen with water. The swollen layers are easily cleaved if a shearing force is applied thereto, and a stable sol is formed in water. Since this property is strongly manifest in bentonite and water-swellable synthetic mica, these substances, the swellable synthetic mica in particular, are suited for the adjustment of elasticity.

(Intermediate Layer)

If heat-sensitive recording layers of different colors are laminated, an intermediate layer may be interposed between the heat-sensitive layers in order to prevent color mixing and the like.

Preferably, the intermediate layer comprises a water-soluble polymer such as polyvinyl alcohol, modified polyvinyl alcohol, methyl cellulose, sodium polystyrenesulfonate, a styrene-maleic acid copolymer, gelatin and/or derivatives thereof, and polyethylene glycol and/or derivatives thereof.

If the intermediate layer is incorporated with a tabular inorganic compound, color mixing can be prevented because the transfer of substance between layers is inhibited or prevented. In addition, storage stability of unused heat-sensitive materials and storage stability of colored images can be improved because supply of oxygen is inhibited.

(Protective Layer)

In the present invention, it is desired to dispose a protective layer, which contains a pigment, a releasing agent, and the like, on the heat-sensitive layer in order to protect the heat-sensitive layer from sticking of the heat-sensitive layer or from being attacked by a solvent or the like.

A tabular inorganic compound such as mica may be used as a pigment singly or in combination with other pigment in the protective layer. Examples of these other pigments include calcium oxide, zinc oxide, titanium oxide, aluminum hydroxide, kaolin, synthetic silicates, amorphous silica, urea-formaldehyde resin particles, and the like.

(Light Transmittance Controlling Layer)

In addition, the heat-sensitive recording material of the present invention may have a light transmittance controlling layer. In the present invention, since the light transmittance controlling layer contains a component which functions as a precursor of an ultraviolet light absorbing agent, and the component does not function as an ultraviolet light absorbing agent before irradiation by a light having a wavelength in the range which is necessary for fixing, the controlling layer manifests a high light transmittance, and when a photo-fixing type heat sensitive recording layer is fixed, a light having a wavelength in the range necessary for the fixing is fully transmitted through the controlling layer, and the visible light transmittance is high. Therefore, no problem is presented to the fixing of the heat-sensitive recording layer.

The precursor of this ultraviolet light absorbing agent begins to function as an ultraviolet light absorbing agent by reacting under the influence of light, heat, and the like after the completion of irradiation by a light having a wavelength in the range necessary for the fixation of the photo-fixing type heat-sensitive recording layer. Therefore, most of the light having a wavelength in the range necessary for the fixation in the ultraviolet region is absorbed by the ultraviolet light absorbing agent. Consequently, the transmittance decreases and the lightfastness of the heat-sensitive recording material increases. However, since there is no visible light absorption effect, the visible light transmittance does not substantially change.

At least one light transmittance controlling layer can be provided in the photo-fixing type heat-sensitive recording material, and in the most desirable case, the controlling layer may be formed between the photo-fixing type heat sensitive recording layer and the protective layer. However, it is also acceptable if the light transmittance controlling layer serves as the protective layer.

Further, by changing the hue of each heat-sensitive recording layer, a multicolor heat-sensitive recording material is obtained. Namely, full-color image recording becomes possible, by selecting three primary colors, yellow, magenta and cyan, in subtractive color mixing as the developed hues of respective heat-sensitive recording layers. In this case, the color developing mechanism of a heat-sensitive recording layer to be directly laminated (lowermost layer of the heat-sensitive recording layers) on the surface of a support is not limited to the combination of an electron-donative dye and an electron-acceptive dye. For example, the color developing system may be selected from a diazo color developing system comprising a diazonium salt and a coupler which reacts with the diazonium salt for color development, a base color developing system which develops color by contact with a basic compound, a chelate color developing system, and a color developing system which develops color by reacting with a nucleophilic reagent to cause a releasing reaction. Desirably, this heat-sensitive recording layer is overlaid with two photo-fixing type heat-sensitive recording layers each containing a diazonium salt compound having a different maximum absorption wavelength and a coupler which reacts with the diazonium salt compound for color development. And, these layers are desirably overlaid sequentially with a light transmittance controlling layer and a protective layer.

In the present invention, in order to further improve the lightfastness, known antioxidants as described in the following publications can be used.

For example, EP 310551A, German Patent Application Laid-Open(OLS) No. 3435443, EP 310552A, Japanese Patent Application Laid-Open (JP-A) No. 3-121449, EP 459416A, JP-A Nos. 2-262654, 2-71262 and 63-163351, U.S. Pat. No. 4,814,262, JP-A Nos. 54-48535, 5-61166 and 5-119449, U.S. Pat. No. 4,980,275, JP-A Nos. 63-113536and 62-262047, EP223739A, 309402A, and 309401A, and the like.

Partial examples of these antioxidants for use in heat-sensitive recording materials and pressure-sensitive recording materials include compounds described in JP-A Nos. 60-125470, 60-125471, 60-125472, 60-287485, 60-287486, 60-287487, 62-146680, 60-287488, 62-282885, 63-89877, 63-88380, 63-088381, 01-239282, 04-291685, 04-291684, 05-188687, 05-188686,05-110490, 05-170361, 63-203372, 63-224989, 63-267594, 63-182484, 60-107384, 60-107383, 61-160287, 61-185483, 61-211079, 63-251282, 63-051174, Japanese Patent Application Publication (JP-B) Nos. 48-043294, 48-033212, and the like.

Specific examples thereof include 6-ethoxy-1-phenyl-2, 2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2, 4-trimethyl-1,2,3,4-tetrahydroquinoline, nickel cyclohexanate, 2,2-bis-4-hydroxyphenylpropane, 1,1-bis-4-hydroxyphenyl-2-ethylhexane, 2-methyl-4-methoxy-diphenylamine, 1-methyl-2-phenylindole, and the like.

These antioxidants may be added to the heat-sensitive recording layer, the intermediate layer, the light transmittance controlling layer, or the protective layer.

EXAMPLES

In order to better explain the present invention, the following examples are given by way of illustration and not by way of limitation. All percentages and parts are by weight unless otherwise specified.

Example 1

[Support]

Wood pulp consisting of 100 parts of LBKP was beaten to 300 cc in Canadian Freeness by use of a double disc refiner and was admixed with 0.5 parts of epoxidized behenic acid amide, 1.0 part of anionic polyacrylamide, 0.1 parts of a polyamidepolyamine-epichlorohydrin adduct, and 0.5 parts of cationic polyacrylamide, each calculated in absolute dry condition based on the weight of the pulp. The pulp was fed to a long-mesh paper machine to produce a base paper having a basis weight of 100 g/$m^2$, which was sized with polyvinyl alcohol in an amount of 1.0 g/$m^2$ in absolute dry condition and then adjusted to a density of 1.0 g/$cm^3$ by calendering. The material thus obtained was used as a substrate.

Then, the mesh wire-facing side (the back) of the paper was subjected to a corona discharge treatment and thereafter was coated with a high-density polyethylene resin to a resin layer thickness of 36 $\mu$m by means of a melt-extruder and thus a resin layer having a mat surface was formed (this face is hereinafter referred to as the back). The polyethylene coating layer on the back was treated with a corona discharge and then coated with an anti-static agent comprising an aqueous dispersion of aluminum oxide ("Alumina Sol 100" manufactured by Nissan Chemical Industries, Co., Ltd.) and silicon dioxide ("Snowtex O" manufactured by Nissan Chemical Industries, Co., Ltd.) in a weight ratio of 1:2 so that a dry coating weight of 0.2 g/$m^2$ was obtained.

Meanwhile, the felt face (the front) of the paper was treated with a corona discharge and thereafter was coated with a low-density polyethylene resin, which had an MFR (melt flow rate) of 3.8 and which contained 10% by weight of anatase-type titanium dioxide, a trace of ultramarine blue, and 0.01% by weight (calculated with respect to polyethylene) of a fluorescent brightening agent represented by the structural formula (IV), to a resin layer thickness of 50 $\mu$m by melt-extrusion. In this way, a resin layer having a glossy surface (this face is hereinafter referred to as the front) of a thermoplastic resin was formed on the substrate. The material thus obtained was used as a support.

[Preparation of a Coating Liquid to Form a Primer Layer]

800 parts of water was added to 100 parts of enzyme-decomposed gelatin (having an average molecular weight of 10,000, a viscosity of 15 mP in accordance with PAGI, and a jelly strength of 20 g in accordance with PAGI) and 26 parts of water-swellable synthetic mica (having an aspect ratio of 1,000), and the resulting mixture was stirred at 40° C. Further, the mixture was admixed with 1,000 parts of methanol and an epoxy-based hardener in an amount corresponding to 5 mmol per 100 g of the gelatin, and stirred. In this way, a coating liquid to form a primer layer was prepared.

The coating liquid thus obtained was coated on the above-described support whose surface had been treated by corona discharge so that the coating weight after drying was 1.3 g/$m^2$, and the coating layer was dried at 80° C. In this way, a primer layer was formed on the support.

[Liquid A to Form a Heat-sensitive Recording Layer]

Preparation of a Liquid Containing an Encapsulated Electron-donative Colorless Dye Precursor 3.0 parts of Crystal Violet lactone as an electron-donative colorless dye precursor was dissolved in 20 parts of ethyl acetate. Then, 20 parts of alkylnaphthalene as a solvent having a high boiling point was added to the solution, and the mixture was made uniform by heating. Next, 20 parts of a xylylene diisocyanate/trimethylolpropane adduct as a capsule wall forming material was added to the solution, and the mixture was made uniform by stirring. Separately, 54 parts of 6 wt % solution of gelatin in water was prepared. To this solution was added the previously prepared solution containing the electron-donative colorless dye precursor. The mixture was emulsified by using a homogenizer. To the resulting emulsion was added 68 parts of water and the mixture was made uniform. The mixture was heated up to 50° C. while being stirred, and an encapsulation reaction was conducted for 3 hours at that temperature. In this way, the intended capsule-containing liquid was obtained. The average particle diameter of the capsules was 1.6 $\mu$m.

Preparation of a Dispersion Liquid of an Electron-acceptive Compound 30 parts of bisphenol A as an electron-acceptive compound was added to 150 parts of 4 wt % solution of gelatin in water, and the mixture was subjected to a dispersing treatment in a ball mill for 24 hours, to prepare a dispersion liquid. The average particle diameter of the electron-acceptive compound in the dispersion was 1.2 $\mu$m.

Preparation of a Liquid A to Form a Heat-sensitive Recording Layer

The liquid containing an encapsulated electron-donative colorless dye precursor and the dispersion liquid of an electron-acceptive compound were mixed such that the ratio of the electron-donative colorless dye precursor to the electron-acceptive compound was 1:2. In this way, a liquid A to form a heat-sensitive recording layer was prepared.

[Liquid B to Form a Heat-sensitive Recording Layer]

Preparation of a Liquid Containing an Encapsulated Diazonium Salt Compound 2.0 parts of 4-(N-(2-(2,4-di-tert-amylphenoxy)butyryl) piperazinobenzenediazonium hexafluorophosphate was dissolved in 20 parts of ethyl acetate. Then, 20 parts of alkylnaphthalene as a solvent having a high boiling point was added to the solution, and the mixture was made uniform by heating.

Next, 15 parts of a xylylene diisocyanate/trimethylolpropane adduct as a capsule wall forming material was added to the solution, and the mixture was made uniform by stirring. Separately, 54 parts of 6 wt % solution of gelatin in water was prepared. To this solution was added the previously prepared solution containing the diazonium salt compound. The mixture was emulsified by using a homogenizer.

To the resulting emulsion was added 68 parts of water and the mixture was made uniform. The mixture was heated up to 40° C. while being stirred, and an encapsulation reaction was conducted for 3 hours at that temperature. In this way, the intended capsule-containing liquid was obtained. The average particle diameter of the capsules was 1.1 μm.

Preparation of a Coupler Emulsified Dispersion 2 parts of 1-(2'-octylphenyl)-3-methyl-5-pyrazolone as a coupler, 2 parts of 1,2,3-triphenylguanidine, 2 parts of 1,1-(p-hydroxyphenyl)-2-ethylhexane, 4 parts of 4,4'-(p-phenylenediisopropylidene)diphenol, 4 parts of 2-ethylhexyl-4-hydroxybenzoate, 0.3 parts of tricresyl phosphate, 0.1 parts of diethyl maleate, and 1 part of 70% solution of calcium dodecylbenzenesulfonate in methanol were dissolved in 10 parts of ethyl acetate so as to prepare a solution. The solution was added to 80 parts of 8 wt % solution of gelatin in water. The mixture was emulsified by using a homogenizer for 10 minutes, and thereafter the ethyl acetate was removed. In this way, the intended emulsified dispersion was obtained.

Preparation of a Liquid B to Form a Heat-sensitive Recording Layer

The liquid containing an encapsulated diazonium salt compound and the coupler emulsion were mixed such that the ratio of the diazonium salt compound to the coupler was 2:3. In this way, a liquid B to form a heat-sensitive recording layer was prepared.

[Liquid C to Form a Heat-sensitive Recording Layer]

Preparation of a Liquid Containing an Encapsulated Diazonium Salt Compound 3.0 parts of 2,5-dibutoxy-4-tolylthiobenzenediazonium hexafluorophosphate was dissolved in 20 parts of ethyl acetate. Then, 20 parts of alkylnaphthalene as a solvent having a high boiling point was added to the solution, and the mixture was made uniform by heating.

Next, 15 parts of a xylylene diisocyanate/trimethylolpropane adduct as a capsule wall forming material was added to the solution, and the mixture was made uniform by stirring. Separately, 54 parts of an 6 wt % solution of gelatin in water was prepared. To this solution was added the previously prepared solution containing the diazonium salt compound. The mixture was emulsified by using a homogenizer.

To the resulting emulsion was added 68 parts of water and the mixture was made uniform. The mixture was heated up to 40° C. while being stirred, and an encapsulation reaction was conducted for 3 hours at that temperature. In this way, the intended capsule-containing liquid was obtained. The average particle diameter of the capsules was 1.0 μm.

Preparation of a Coupler Emulsified Dispersion 2 parts of 2-chloro-5-(3-(2,4-di-tert-pentyl)phenoxypropylamino)acetoacetanilide as a coupler, 2 parts of 1,2,3-triphenylguanidine, 2 parts of 1,1-(p-hydroxyphenyl)-2-ethylhexane, 4 parts of 4,4'-(p-phenylenediisopropylidene)diphenol, 4 parts of 2-ethylhexyl-4-hydroxybenzoate, 0.3 parts of tricresyl phosphate, 0.1 parts of diethyl maleate, and 1 part of 70% solution of calcium dodecylbenzenesulfonate in methanol were dissolved in 10 parts of ethyl acetate so as to prepare a solution. The solution was added to 80 parts of 8 wt % solution of gelatin in water. The mixture was emulsified by using a homogenizer for 10 minutes, and thereafter the ethyl acetate was removed. In this way, the intended emulsion was obtained.

Preparation of a Liquid C to Form a Heat-sensitive Recording Layer

The liquid containing an encapsulated diazonium salt compound and the coupler emulsion were mixed such that the ratio of the diazonium salt compound to the coupler was 4:5. In this way, a liquid C to form a heat-sensitive recording layer was prepared.

[Preparation of a Liquid to Form a Light Transmittance Controlling Layer]

Preparation of a Liquid Containing an Encapsulated Precursor of Ultraviolet Light Absorbing Agent 10 parts of [2-allyl-6-(2H-benzotriazole-2-yl)-4-t-octyl phenyl]benzenesulfonate, 3 parts of 2,5-di-t-octyl-hydroquinone, 2 parts of tricresyl phosphate, and 4 parts of α-methylstyrene dimer were dissolved in 30 parts of ethyl acetate so as to prepare a solution of precursor of ultraviolet light absorbing agent.

Next, 20 parts of a xylylene diisocyanate/trimethylolpropane adduct as a capsule wall forming material was added to the solution, and the mixture was made uniform by stirring. Separately, 200 parts of an 8% aqueous solution of itaconic acid-modified polyvinyl alcohol was prepared. To this solution was added the previously prepared solution containing the precursor of ultraviolet light absorbing agent. The mixture was emulsified by using a homogenizer.

To the resulting emulsion was added 120 parts of water and the mixture was made uniform. The mixture was heated up to 40° C. while being stirred, and an encapsulation reaction was conducted for 3 hours at that temperature, to obtain the intended capsule-containing liquid. The average particle diameter of the capsules was 0.3 μm.

Preparation of a Liquid to Form a Light Transmittance Controlling Layer 10 parts of a 2% aqueous solution of sodium (4-nonylphenoxytrioxyethylne)butylsulfonate was added to 100 parts of the above-described liquid containing an encapsulated precursor of ultraviolet light absorbing agent to thereby prepare a liquid to form a light transmittance controlling layer.

[Preparation of a Liquid to Form an Intermediate Layer]

2 parts of a 2% aqueous solution of sodium (4-nonylphenoxytrioxyethylne)butylsulfonate was added to 100 parts of a 10% aqueous solution of gelatin to thereby prepare a liquid to form an intermediate layer.

[Preparation of a Liquid to Form a Protective Layer]

To 61 parts of a 5.0% aqueous solution of ethylene-modified polyvinyl alcohol were added 2.0 parts of a 20.5% aqueous dispersion of zinc stearate (Hydrin F115 manufactured by Chukyo Yushi Co., Ltd.), 8.4 parts of a 2% aqueous solution of sodium (4-nonylphenoxytrioxyethylne)butylsulfonate, 8.0 parts of a fluorine-based releasing agent (ME-313 manufactured by Daikin Co., Ltd.), and 0.5 parts of wheat starch, and the mixture was made uniform by stirring. In this way a PVA solution was prepared.

Separately, 12.5 parts of a 20 wt % aqueous solution of Kaogloss (manufactured by Shiraishi Industry Co., Ltd.), 1.25 parts of a 10 wt % aqueous solution of polyvinyl alcohol (PVA 105 manufactured by Kuraray Co., Ltd.), and 0.39 parts of a 2 wt % aqueous solution of sodium dodecylsulfonate were mixed together, and the mixture was subjected to a dispersing treatment in a Dyno mill to thereby prepare a pigment dispersion. Then 4.4 parts of the pigment dispersion was added to 80 parts of the PVA solution. In this way, a liquid to form a protective layer was prepared.

[Preparation of a Heat-sensitive Recording Material]

On the support having a primer layer provided thereon were formed a heat-sensitive recording layer A, an intermediate layer, a heat-sensitive recording layer B, an intermediate layer, a heat-sensitive recording layer C, a light transmittance controlling layer, and a protective layer by sequentially applying the above-described respective liquids in that order to the primer layer at a coating speed of 60 m/minute, thus forming 7 layers consecutively. The support having these layers was dried in a condition of 30° C. and 30% relative humidity and then in a condition of 40° C. and 30% relative humidity. In this way, a multicolor heat-sensitive recording material was obtained. Coating weights based on solids for the layers were as follows; 6.0 $g/m^2$ for the heat-sensitive recording layer A, 3.0 $g/m^2$ for the intermediate layer, 6.0 $g/m^2$ for the heat-sensitive recording layer B, 3.0 $g/m^2$ for the intermediate layer, 5.0 $g/m^2$ for the heat-sensitive recording layer C, 3.0 $g/m^2$ for the light transmittance controlling layer, and 1.5 $g/m^2$ for the protective layer.

Example 2

A heat-sensitive recording material was prepared by repeating the procedure of Example 1, except that 0.03% by weight (calculated with respect to polyethylene) of the fluorescent brightening agent represented by the structural formula (IV) was used.

Example 3

A heat-sensitive recording material was prepared by repeating the procedure of Example 1, except that 0.06% by weight (calculated with respect to polyethylene) of the fluorescent brightening agent represented by the structural formula (IV) was used.

Example 4

A heat-sensitive recording material was prepared by repeating the procedure of Example 1, except that 0.09% by weight (calculated with respect to polyethylene) of the fluorescent brightening agent represented by the structural formula (IV) was used.

Example 5

A heat-sensitive recording material was prepared by repeating the procedure of Example 1, except that 0.13% by weight (calculated with respect to polyethylene) of the fluorescent brightening agent represented by the structural formula (IV) was used.

Example 6

A heat-sensitive recording material was prepared by repeating the procedure of Example 1, except that 0.06% by weight (calculated with respect to polyethylene) of the fluorescent brightening agent represented by the structural formula (V) was used.

Comparative Example 1

A heat-sensitive recording material was prepared by repeating the procedure of Example 1, except that no fluorescent brightening agent was incorporated into the thermoplastic resin layer on the surface.

Comparative Example 2

A heat-sensitive recording material was prepared by repeating the procedure of Example 1, except that no fluorescent brightening agent was incorporated into the thermoplastic resin layer on the surface and that 0.37% by weight of a diaminostilbenesulfonic acid derivative (Whitex BB manufactured by Sumitomo Chemical Co., Ltd.), calculated with respect to the total amount of the liquid A to form the heat-sensitive recording layer, was added to the liquid A to form the heat-sensitive recording layer.

[Measurement of the Whiteness of the Support]

For the purpose of measuring the whiteness of the support prior to the coating of the heat-sensitive layers, the reflectance to light having a wavelength of 440 nm of the supports was measured by using Color Analyzer Model 607 manufactured by Hitachi Ltd.

[Measurement of the Whiteness of the Heat-sensitive Material After Fixing Process]

The heat-sensitive materials were exposed to light having a central wavelength of 420 nm radiated from an ultraviolet light lamp having an output power of 40 W for 10 seconds, and then to light having a central wavelength of 365 nm radiated from an ultraviolet light lamp having an output power of 40 W for 15 seconds. After that, the reflectance to light having a wavelength of 440 nm of the materials was measured by using Color Analyzer Model 607 manufactured by Hitachi Ltd.

[Test for Bleeding-out of the Fluorescent Brightening Agents]

For the purpose of evaluating the reduction of whiteness, the presence or absence of the bleeding-out of the fluorescent brightening agents was tested. In the test, the supports were thermally treated at 120° C. for 3 minutes, cooled down, and again thermally treated at 100° C. for 24 hours. Then, the reduction of the whiteness was visually evaluated according to the following criteria:

○: yellowing is hardly observed
Δ: slight yellowing is observed
X: significant yellowing is observed

[Fixing Time]

The heat-sensitive materials were exposed to light having a central wavelength of 420 nm radiated from an ultraviolet light lamp having an output power of 40 W for 10 seconds. Then, the time required for the optical density of the background region to reach 0.30 by irradiation thereof with light having a central wavelength of 365 nm radiated from an ultraviolet light lamp having an output power of 40 W was measured.

The results are shown in Table 1.

TABLE 1

| | | Ex. 1 | Ex. 2 | Ex. 3 | Ex. 4 | Ex. 5 | Ex. 6 | C.E. 1 | C.E. 2 |
|---|---|---|---|---|---|---|---|---|---|
| Thermoplastic resin layer | Structural formulas of fluorescent brightening agents | Structural formula (IV) | Structural formula (IV) | Structural formula (IV) | Structural formula (IV) | Structural formula (IV) | Structural formula (V) | — | — |
| | Content of fluorescent brightening agent (% by weight) | 0.01 | 0.03 | 0.06 | 0.09 | 0.13 | 0.06 | 0 | 0 |
| Incorporation of fluorescent brightening agent into heat-sensitive recording layer | | No | No | No | No | No | No | No | Yes |
| Whiteness of support (%) | | 92 | 97 | 102 | 104 | 95 | 103 | 89 | 88 |
| Whiteness of background region after fixing process (%) | | 71 | 78 | 82 | 84 | 75 | 83 | 69 | 82 |
| Bleeding out | | ○ | ○ | ○ | ○ | Δ | ○ | ○ | ○ |
| Fixing time (sec) | | 9 | 8 | 7 | 8 | 11 | 8 | 9 | 16 |

Ex.: Example
C.E.: Comparative Example

The heat-sensitive recording layer of the heat-sensitive recording materials according to the present invention as described in the examples does not contain any fluorescent brightening agent. Because of this, the progress of the fixing process of the heat-sensitive recording materials according to the present invention is not inhibited when images are recorded. And, the fixing time of the heat-sensitive recording materials according to the present invention is evidently shorter in comparison with that of the heat-sensitive recording material of Comparative Example 2 whose recording layer contains a fluorescent brightening agent. A fluorescent brightening agent is incorporated in the thermoplastic resin layer in the case of the heat-sensitive recording layer of the heat-sensitive recording materials of the present invention as described in the examples. Because of this, the whiteness level of the background region after fixing process is evidently higher in comparison with that of the heat-sensitive recording material of Comparative Example 1 whose thermoplastic resin layer does not contain a fluorescent brightening agent.

As can be seen from the results of Example 5, slight bleeding-out of a fluorescent brightening agent tends to occur as the content of the fluorescent brightening agent in the thermoplastic resin layer increases. On the other hand, as can be seen from the results of Example 1, the whiteness of the background region after fixing process tends to be reduced if the content of the fluorescent brightening agent is insufficient.

Based on the results described above, the heat-sensitive recording material of the present invention is advantageous in that fixing time is short; in that the background region after fixing process is highly white; and in that the bleeding-out of the fluorescent brightening agent does not occur. Further, it is clear that these properties can be further improved by adjusting the content of the fluorescent brightening agent.

What is claimed is:

1. A heat-sensitive recording material comprising: a support comprised of a substrate and a thermoplastic resin layer formed thereon, and a heat-sensitive recording layer disposed on the support and containing a diazonium salt compound capable of being decomposed by ultraviolet light, wherein the thermoplastic resin layer is formed by melt extrusion and wherein the thermoplastic resin layer contains a fluorescent brightening agent and a white pigment.

2. A heat-sensitive recording material according to claim 1, wherein the fluorescent brightening agent is a compound represented by the following structural formula (I):

Structural Formula (I)

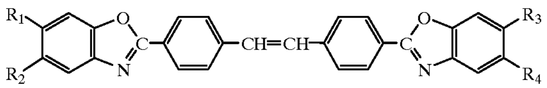

wherein $R_1$, $R_2$, $R_3$, and $R_4$ each represent a hydrogen atom, or a substituent group or a substituent atom.

3. A heat-sensitive recording material according to claim 1, wherein the content of the fluorescent brightening agent in the thermoplastic resin layer is in the range of from 0.02 to 0.10% by weight based on the thermoplastic resin.

4. A heat-sensitive recording material according to claim 1, wherein the thermoplastic resin is a polyolefin resin.

5. A heat-sensitive recording material according to claim 1, wherein the white pigment is titanium oxide.

6. A heat-sensitive recording material according to claim 1, wherein the ultraviolet light has a wavelength in the range of from 300 to 400 nm.

7. A heat-sensitive recording material according to claim 2, wherein the content of the fluorescent brightening agent in the thermoplastic resin layer is in the range of from 0.02 to 0.10% by weight based on the thermoplastic resin.

8. A heat-sensitive recording material according to claim 2, wherein the thermoplastic resin is a polyolefin resin.

9. A heat-sensitive recording material according to claim 2, wherein the white pigment is titanium oxide.

10. A heat-sensitive recording material according to claim 2, wherein the ultraviolet light has a wavelength in the range of from 300 to 400 nm.

* * * * *